United States Patent
Cheng

(10) Patent No.: US 7,823,003 B1
(45) Date of Patent: Oct. 26, 2010

(54) VOLTAGE REFERENCING CLOCK FOR SOURCE-SYNCHRONOUS MULTI-LEVEL SIGNAL BUSES

(75) Inventor: Christopher Cheng, Cupertino, CA (US)

(73) Assignee: 3PAR, Inc., Fremont, CA (US)

( * ) Notice: Subject to any disclaimer, the term of this patent is extended or adjusted under 35 U.S.C. 154(b) by 896 days.

(21) Appl. No.: 11/626,265

(22) Filed: Jan. 23, 2007

(51) Int. Cl.
*G06F 1/04* (2006.01)
*H03K 19/082* (2006.01)
(52) U.S. Cl. .................. 713/600; 326/93; 326/105
(58) Field of Classification Search .............. 713/600; 326/93, 105
See application file for complete search history.

(56) References Cited

U.S. PATENT DOCUMENTS

| | | | |
|---|---|---|---|
| 6,317,469 B1* | 11/2001 | Herbert | 375/293 |
| 6,477,205 B1* | 11/2002 | Doblar et al. | 375/259 |
| 6,762,623 B2* | 7/2004 | Suryanarayana et al. | 326/105 |
| 2007/0046334 A1* | 3/2007 | Hairapetian | 326/86 |
| 2008/0211543 A1* | 9/2008 | Gruijl | 326/93 |

* cited by examiner

*Primary Examiner*—Vincent T Tran
(74) *Attorney, Agent, or Firm*—Patent Law Group LLP; David C. Hsia

(57) ABSTRACT

An input circuit is provided for coupling to a source-synchronous multi-level bus carrying data, clock, and complementary clock signals. The clock and complementary clock signals have a less than full voltage swing than the data signal so they can act as reference voltages for the data signal. The circuit includes a first differential receiver having inputs coupled to the data and the clock signals, a second differential receiver having inputs coupled to the data signal and a reference signal, and a third differential receiver having inputs coupled to the data and the complementary clock signals. The circuit further includes first, second, and third flip-flops having data inputs coupled to outputs of the first, the second, and the third differential receivers, and clock inputs coupled to a delayed clock signal generated from the clock and the complementary clock signals. The outputs of the flip-flops determine the level of the data signal.

8 Claims, 4 Drawing Sheets

VOLTAGE REFERENCING CLOCK FOR SOURCE-SYNCHRONOUS MULTI-LEVEL SIGNAL BUSES

FIELD OF INVENTION

This invention relates to source-synchronous multi-level signal buses.

DESCRIPTION OF RELATED ART

FIG. 1 illustrates a conventional source-synchronous bus system 100 where a sender provides data signals d0, d1 ... dn along with clock signal clk and its complement signal /clk to a receiver. Differential clock signals clk and /clk are running at half the data rate and at 180 degree phase offset from each other.

At the receiving end, differential receivers 102 and 104 receive clock signals clk and /clk and generate single-ended clock signals clk' and /clk', respectively. Delay lines 106 and 108 receive clock signals clk and /clk' and generate delayed clock signals clk" and /clk", respectively, to sample the incoming data signals at the middle of the data cycles. Clocked by delay clock signal clk", flip-flops 112-0, 112-1 ... 112-$n$ capture the first half of data signals d0 to dn (represented as data bits a0, a1 ... an). Clocked by delayed clock signal /clk", flip-flops 114-0, 114-1 ... 114-$n$ capture the second half of data signals d0 to dn (represented as data bits b0, b1 ... bn).

Differential receivers 116-0, 116-1 ... 116-$n$ receive data signals d0, d1 ... dn, respectively, and use a common reference voltage vref to determine the values of the incoming data. Output of each differential receivers 116-0, 116-1 ... 116-$n$ is provided to two flip-flops to capture the two halves of the data as described above. For example, the output differential receiver 116-0 is provided to flip-flops 112-0 and 114-0 to capture the two halves of data signal d0 as data bits a0 and b0, the output differential receiver 116-1 is provided to flip-flops 112-1 and 114-1 to capture the two halves of data signal d1 as data bits a1 and b1, and so on.

FIG. 2A illustrates conventional binary level signaling where a data bit 0 or 1 is sent every clock cycle. At the receiving end, a data signal is compared with a reference voltage Vref. If the voltage level of the data signal is greater reference voltage Vref, then the data bit is considered to have a logic value of 1. Otherwise if the voltage level of the data signal is below reference voltage Vref, then the data bit is considered to have a logic value of 0.

FIG. 2B illustrates conventional multi-level singling where data bits are sent at half the clock speed. Two data bits are combined to form one multi-level bit. Since there are four possible binary states of (0,0), (0,1), (1,0), and (1,1), there are 4 possible signal levels representing each of the binary states (levels=0, 1, 2, and 3).

As shown in FIG. 2C, a data signal is compared to three reference voltages to determine the level of the binary bit at the receiving end. If the voltage level of the data signal is less than reference voltages Vref−, Vref0, and Vref+ (e.g., 0.5, 1.5, and 2.5 V), then the data bit is considered logic level 0. If the voltage level of the data signal is greater than reference voltage Vref− but less than reference voltages Vref0 and Vref+, then the data bit is considered logic level 1. If the voltage level of the data signal is greater than reference voltages Vref− and Vref0 but less than reference voltage Vref+, then the data bit is considered logic level 2. If the voltage level of the data signal is greater than reference voltages Vref−, Vref0, and Vref+, then the data bit is considered logic level 3.

FIG. 3 illustrates a conventional source-synchronous multi-level bus system 300 where differential clock signals clk and /clk are running at half the data rate and at 180 degree phase offset from each other. Note that clock signals clk and /clk take the full swing from level 0 to level 3 (e.g., 0 to 3 V).

At the receiving end, differential receivers 302 and 304 receive clock signals clk and /clk and generate single-ended clock signals clk' and /clk', respectively. Delay lines 306 and 308 receive clock signals clk and /clk' and generate delayed clock signals clk" and /clk", respectively, to sample the incoming data signals at the middle of the data cycles. Clocked by delayed clock signal clk", flip-flops 312-0, 312-1, and 312-2 capture data bits a0, a1, and a2 for determining the logic level of the first half of data signal d. Clocked by delayed clock signal /clk", flip-flops 314-0, 314-1, and 314-2 captures data bits b0, b1, and b2 for determining the logic level of the second half of data signal d.

Three differential receivers 316-0, 316-1, and 316-2 are provided for data signal d. Differential receiver 316-0 has a non-inverted input coupled to data signal d, and an inverted input coupled to reference voltage Vref−. Differential receiver 316-1 has a non-inverted input coupled to data signal d, and an inverted input coupled to reference voltage Vref0. Differential receiver 316-2 has a non-inverted input coupled to data signal d, and an inverted input coupled to reference voltage Vref+. Output of each differential receivers 316-0 to 316-2 is provided to two flip-flops to capture the two halves of data signal d as described above. Specifically, the output differential receiver 316-0 is provided to flip-flops 312-0 and 314-0 to capture the two halves of data signal d as data bits a0 and b0, the output differential receiver 316-1 is provided to flip-flops 312-1 and 314-1 to capture the two halves of data signal d as data bits a1 and b1, and the output differential receiver 316-2 is provided to flip-flops 312-2 and 314-2 to capture the two halves of data signal d as data bits a2 and b2.

As can be seen, the overall design of conventional source-synchronous multi-level system 300 can be simplified by reducing the number of reference voltage pins. Thus, what is needed is a source-synchronous multi-level system that requires less reference voltage pins.

SUMMARY

In one embodiment of the invention, an input circuit is provided for coupling to a source-synchronous multi-level bus that carries data, clock, and complementary clock signals. The clock and complementary clock signals have a less than full voltage swing than the data signal so they can act as reference voltages for the data signal. The circuit includes a first differential receiver having inputs coupled to the data and the clock signals, a second differential receiver having inputs coupled to the data signal and a reference signal, and a third differential receiver having inputs coupled to the data and the complementary clock signals. The circuit further includes first, second, and third flip-flops having data inputs coupled to outputs of the first, the second, and the third differential receivers, and clock inputs coupled to a delayed clock signal generated from the clock and the complementary clock signals. The outputs of the flip-flops determine the level of the data signal.

BRIEF DESCRIPTION OF THE DRAWINGS

Use of the same reference numbers in different figures indicates similar or identical elements.

DETAILED DESCRIPTION

Figure 1:
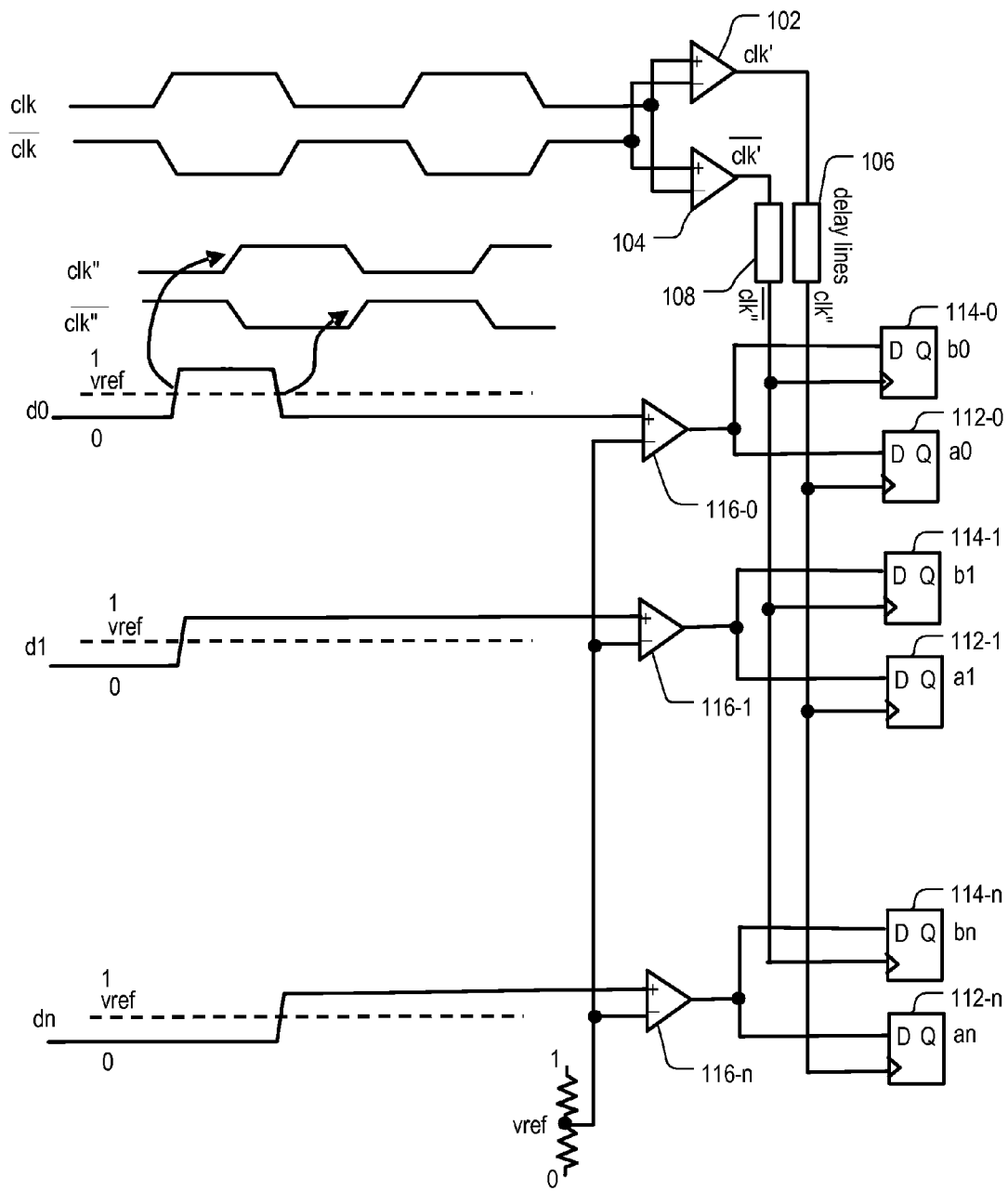
FIG. 1 is a block diagram of a conventional source-synchronous bus system.
Figure 2A:
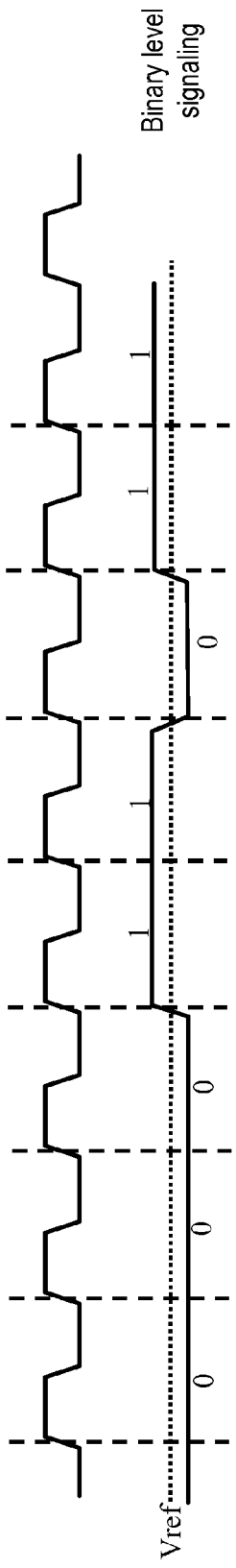
FIG. 2A is a timing diagram of conventional binary level signaling.
Figure 2B:
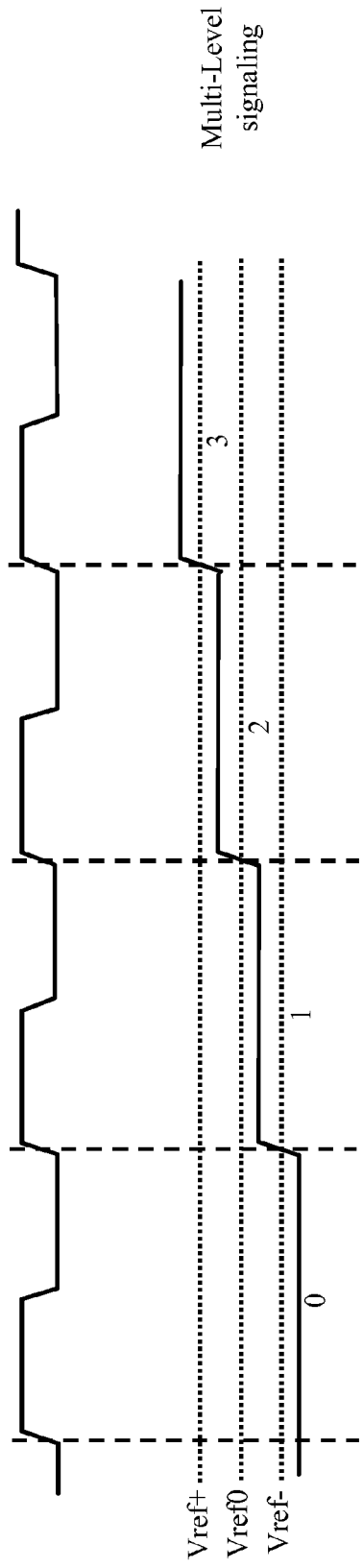
FIGS. 2B and 2C are timing diagrams of conventional multi-level signaling.
Figure 2C:
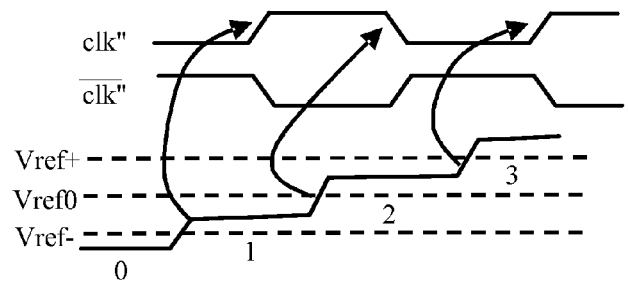
Figure 3:
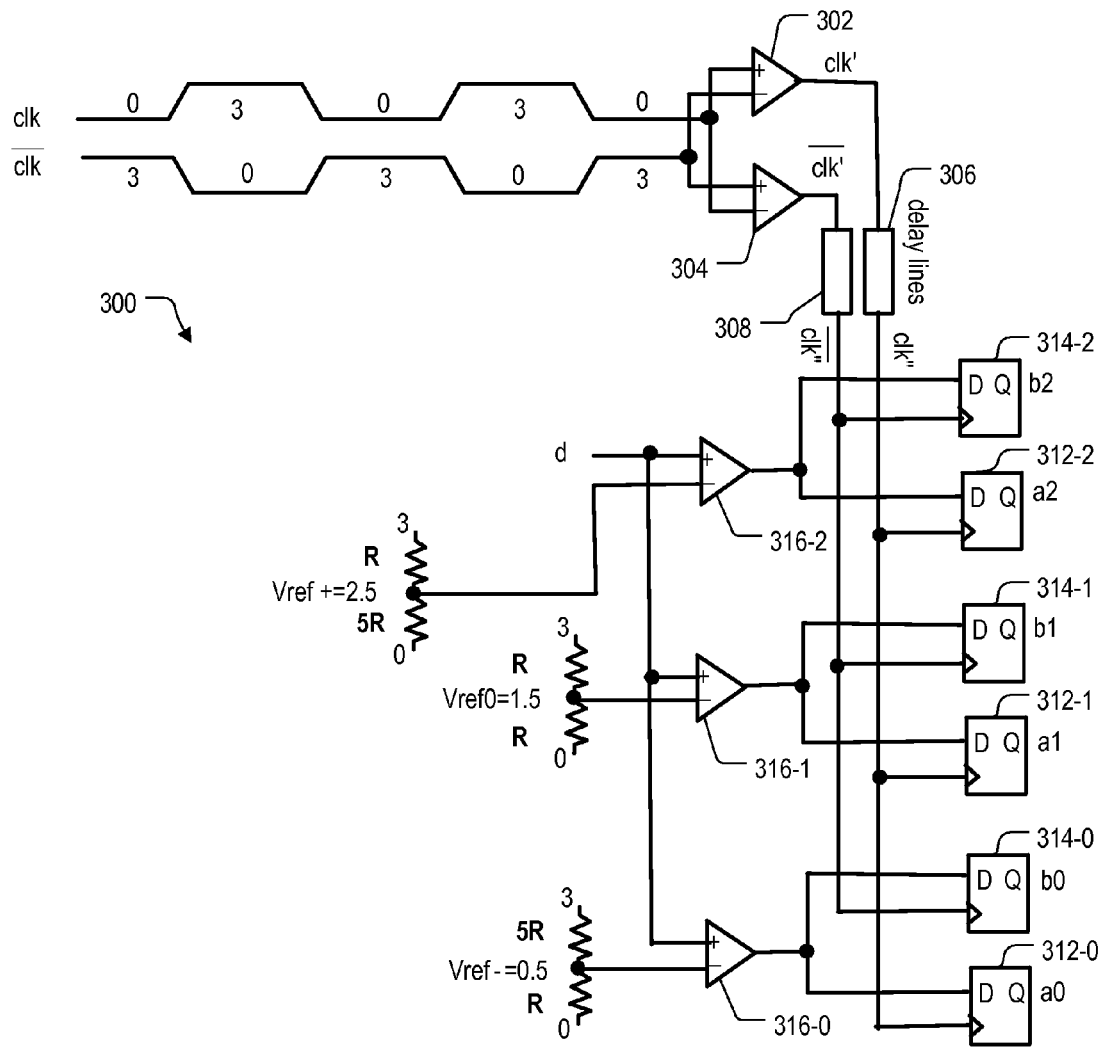
FIG. 3 is a block diagram of a conventional source-synchronous multi-level bus system.
Figure 4:
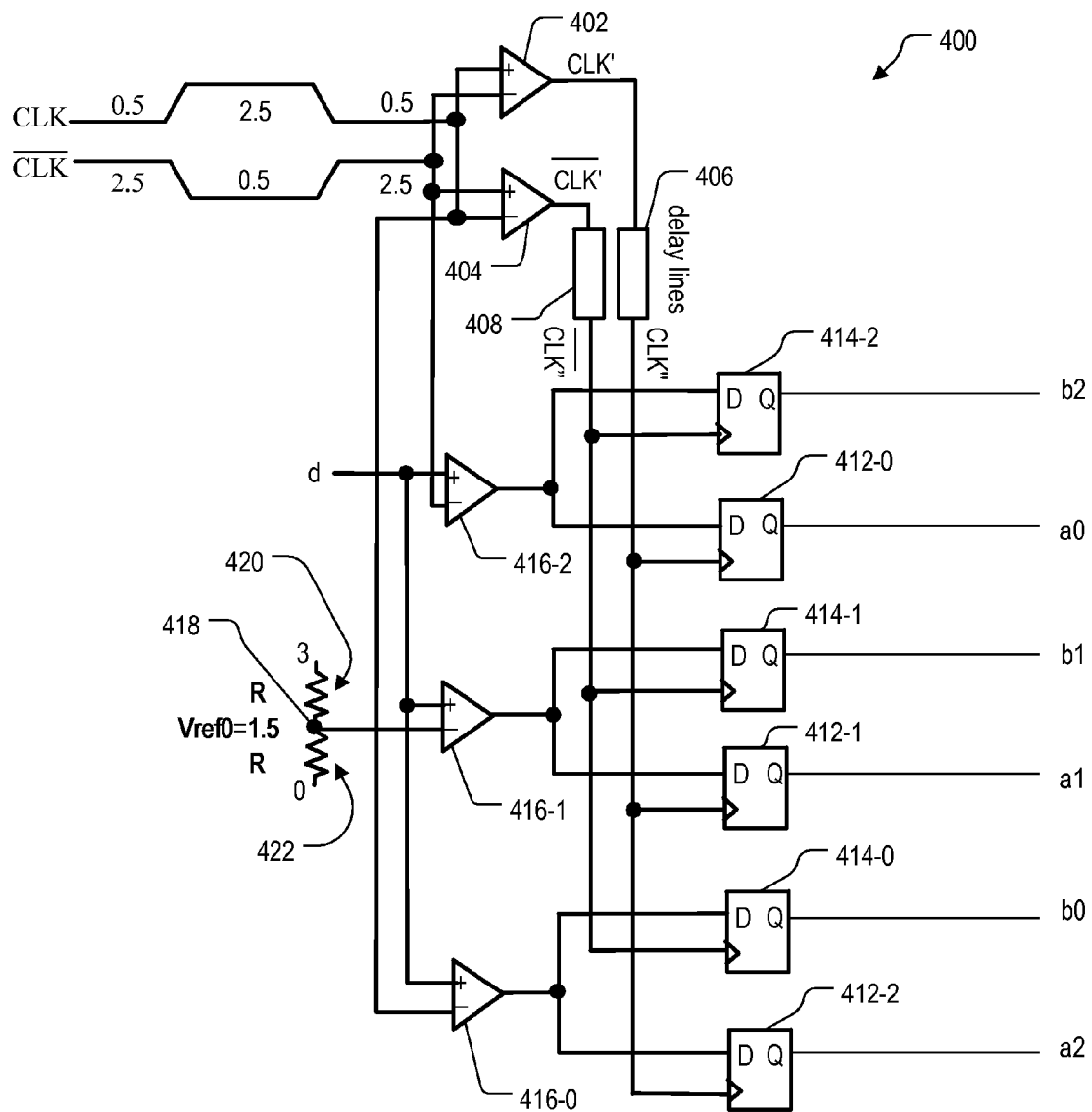
FIG. 4 is a block diagram of a source-synchronous multi-level bus system in one embodiment of the invention.

FIG. 4 is a block diagram of a source-synchronous multi-level bus system 400 in one embodiment of the invention. In system 400, the incoming differential clock signals CLK and /CLK are running at half the data rate and at 180 degree phase offset from each other. Unlike clock signals clk and /clk in conventional system 300, clock signals CLK and /CLK do not take the full swing from level 0 to level 3 (e.g., 0 to 3 V) like a data signal. Instead, clock signals CLK and /CLK swing between two of the three reference voltage levels in conventional system 300. In one embodiment, clock signals CLK and /CLK swing between the voltage levels of reference voltages Vref− and Vref+ (e.g., 0.5 and 2.5 V) in conventional system 300. This is because clock signals CLK and /CLK are used as two of the three reference voltages for determining the logical level of a data signal in order to save two out of three reference voltage pins needed in conventional system 300.

A differential receiver 402 has non-inverted and inverted input terminals coupled to clock signals CLK and /CLK, respectively, and generates a single-ended clock signal CLK'. A differential receiver 404 has non-inverted and inverted input terminals coupled to clock signals /CLK and CLK, respectively, and generates a single-ended clock signals /CLK'. A delay line 406 has an input terminal coupled to receive clock signal CLK' and generates a delayed clock signal CLK". A delay line 408 has an input terminal coupled to receive clock signal /CLK' and generates a delayed clock signal /CLK". Clock signals CLK" and /CLK" are used to sample the incoming data signals at the middle of the data cycles to maximize the setup and the hold times.

Flip-flops 412-0, 412-1, and 412-2 have their clock terminals coupled to receive clock signal CLK", and their data input terminals coupled to the output terminals of respective differential receivers 416-0, 416-0, and 416-2. Thus, flip-flops 412-0, 412-1, and 412-2 capture data bits a0, a1, and a2 for determining the logic level of the first half of data signal d.

Flip-flops 414-0, 414-1, and 414-2 have their clock terminals coupled to receive clock signal /CLK" and their data input terminals coupled to the output terminals of respective differential receivers 416-0, 416-0, and 416-2. Thus, flip-flops 414-0, 414-1, and 414-2 capture data bits b0, b1, and b2 for determining the logic level of the first half of data signal d.

Differential receivers 416-0, 416-1, and 416-2 have their non-inverted input terminals coupled to receive data signal d. Differential receiver 416-0 has its inverted input terminal coupled to receive clock signal CLK, which now acts as a first reference voltage that alternates between the voltage levels of Vref− and Vref+.

Differential receiver 416-1 has its inverted input terminal coupled to a second reference voltage Vref0. Reference voltage Vref0 may be provided from a node 418 between a resistor 420 coupled to rail and another resistor 422 coupled to ground.

Differential receiver 416-2 has its inverted input terminal coupled to clock signal/CLK, which now acts as a third reference voltage that alternates between the voltage levels of Vref− and Vref+.

As described above, the output of each differential receivers 416-0 to 416-2 is provided to two flip-flops to capture the two halves of data signal d as described above. For Specifically, the output differential receiver 416-0 is provided to flip-flops 412-2 and 414-0 to capture the two halves of data signal d as data bits a2 and b0, the output differential receiver 416-1 is provided to flip-flops 412-1 and 414-1 to capture the two halves of data signal d as data bits a1 and b1, and the output differential receiver 416-2 is provided to flip-flops 412-0 and 414-2 to capture the two halves of data signal d as data bits a0 and b2

Note that flip-flop 412-2 captures data bit a2 because the reference signal to differential receiver 416-0 (CLK) is high when the clock input to flip-flop 412-2 (CLK") switches from low to high. Similarly, flip-flop 412-0 captures data bit a0 because the reference signal to differential receiver 416-2 (/CLK) is low when the clock input to flip-flop 412-0 (CLK") switches from low to high.

Various other adaptations and combinations of features of the embodiments disclosed are within the scope of the invention. Numerous embodiments are encompassed by the following claims.

What is claimed is:

1. A method for a source-synchronous multi-level system to use referencing source clocks signals, comprising:

receiving a data signal, a clock signal, and a complementary clock signal from a source-synchronous bus, the data signal being a multi-level signal, the clock signal and the complementary clock signal having a voltage swing less than a full voltage swing of the data signal;

comparing the data signal to the clock signal and generating a first result signal based on said comparing the data signal to the clock signal;

comparing the data signal to a reference signal and generating a second result signal based on said comparing the data signal to the reference signal;

comparing the data signal to the complementary clock signal and generating a third result signal based on said comparing the data signal to the complementary clock signal; and determining a level of the data signal based on the first, the second, and the third result signals.

2. The method of claim 1, further comprising:

delaying the clock signal and the complementary clock signal; and clocking the first, the second, and the third result signals into first, second, and third flip-flops, respectively, using the delayed clock signal.

3. The method of claim 2, further comprising:

clocking the first, the second, and the third result signal into fourth, fifth, and sixth flip-flops, respectively, using the delayed complementary clock signal.

4. The method of claim 3, further comprising:

determining first, second, and third data bits in a first half of the data signal from the third, the second, and the first flip-flops, respectively; and determining first, second, and third data bits in a second half of the data signal from the fourth, the fifth, and the sixth flip-flops, respectively.

5. An input circuit for coupling to a source-synchronous multi-level bus carrying data, clock, and complementary clock signals, the circuit comprising:

a first differential receiver having non-inverted and inverted input terminals coupled to the data and the clock signals, respectively;

a second differential receiver having non-inverted and inverted input terminals coupled to the data signal and a reference signal, respectively;

a third differential receiver having non-inverted and inverted input terminals coupled to the data and the complementary clock signals, respectively; and wherein the clock signal and the complementary clock signal have a voltage swing less than a full voltage swing of the data signal.

6. The circuit of claim 5, further comprising:

a fourth differential receiver having non-inverted and inverted input terminals coupled to receive the clock and the complementary clock signals, respectively;

a fifth differential receiver having non-inverted and inverted input terminals coupled to receive the complementary clock and the clock signals, respectively;

a first delay line coupled to an output terminal of the fourth differential receiver;

a second delay line coupled to an output terminal of the fifth differential receiver;

a first flip-flop having:
   a data input terminal coupled to an output of the first differential receiver; and
   a clock terminal coupled to an output of the first delay line;

a second flip-flop having:
   a data input terminal coupled to an output of the second differential receiver; and
   a clock terminal coupled to the output of the first delay line; and a third flip-flop having:
   a data input terminal coupled to an output of the third differential receiver; and
   a clock input terminal coupled to the output of the first delay line.

7. The circuit of claim 6, further comprising:

a fourth flip-flop having:
   a data input terminal coupled to the output of the first differential receiver; and
   a clock terminal coupled to an output of the second delay line;

a fifth flip-flop having:
   a data input terminal coupled to the output of the second differential receiver; and
   a clock terminal coupled to the output of the second delay line; and a sixth flip-flop having:
   a data input terminal coupled to the output of the third differential receiver; and
   a clock input terminal coupled to the output of the second delay line.

8. The circuit of claim 7, wherein:

the third, the second, and the first flip-flops output first, second, and third data bits in a first half of the data signal, respectively; and the fourth, the fifth, and the sixth flip-flops output first, second, and third data bits in a second half of the data signal, respectively.

* * * * *